United States Patent [19]
Wolf

[11] Patent Number: 5,233,630
[45] Date of Patent: Aug. 3, 1993

[54] METHOD AND APPARATUS FOR RESOLVING PHASE AMBIGUITIES IN TRELLIS CODED MODULATED DATA

[75] Inventor: Jack K. Wolf, Rancho Mirage, Calif.

[73] Assignee: Qualcomm Incorporated, San Diego, Calif.

[21] Appl. No.: 695,397

[22] Filed: May 3, 1991

[51] Int. Cl.$^5$ .......................................... H04L 27/20
[52] U.S. Cl. ........................................ 375/67; 375/86; 371/43
[58] Field of Search ............... 375/37, 67, 39, 83, 375/86, 52, 53, 56; 371/30, 43, 44, 45; 341/76; 332/103; 329/304

[56] References Cited

U.S. PATENT DOCUMENTS

| | | | |
|---|---|---|---|
| 3,789,360 | 1/1974 | Clark, Jr. et al. | 340/146 |
| 4,462,101 | 7/1984 | Yasuda et al. | 371/43 |
| 4,586,182 | 4/1986 | Gallager | 375/39 |
| 4,993,046 | 2/1991 | Saito et al. | 371/43 |
| 5,115,453 | 5/1992 | Calderbank et al. | 375/39 |

OTHER PUBLICATIONS

"Practical Applications of TCM", Houtan Dehesh et al., 1990 IEEE Military Communications Conference, Sep. 30-Oct. 3, 1990, pp. 15.3.1-15.3.4
"Trellis-Coded MPSK Modulation for Highly Efficient Military Satellite Applications" by Andrew J. Viterbi et al., 1988 Military Communications Conference, Oct. 23-26, 1988, pp. 35.2.1-35.2.5.
"A Pragmatic Approach to Trellis-Coded Modulation" by Andrew J. Viterbi et al., Jul. 1989-IEEE Communications Magazine, pp. 11-19.
"A 25 MHz Viterbi FEC Code" by Richard Kerr et al. 1990 IEEE Custom Integrated Circuit Conference Proceedings, May 13-16, 1990, pp. 13.6.1-13.6.5.

*Primary Examiner*—Stephen Chin
*Attorney, Agent, or Firm*—Russell B. Miller

[57] ABSTRACT

A codec for resolving transmission phase ambiguities in the M-ary PSK modulation of trellis coded data. A trellis encoder uses a differential encoder and a convolutional encoder, along with multiplexed differential encoders, to generate from sets of input data bits corresponding phase point values for use in M-ary PSK carrier modulation. A trellis decoder uses a Viterbi decoder and a differential decoder, along with multiplexed differential decoders, to produce estimates of the original input data bits from the received signal sector value.

41 Claims, 5 Drawing Sheets

METHOD AND APPARATUS FOR RESOLVING PHASE AMBIGUITIES IN TRELLIS CODED MODULATED DATA

BACKGROUND OF THE INVENTION

I. Field of the Invention

The present invention relates to data communications. More particularly, the present invention relates to a novel and improved method and apparatus for resolving phase ambiguities in trellis coded modulated data.

II. Description of the Related Art

The field of data communications is concerned with raising the data throughput of a transmission system with a limited signal to noise ratio (SNR). The use of error correcting circuitry such as the Viterbi decoder allows system tradeoffs to be made with smaller SNRs or higher data rates to be used with the same bit error rate (BER). The decrease in the SNR needed is generally referred to as coding gain. Coding gain may be determined from simulated bit error performance curves. In a graph of simulated bit error performance curves the BER of uncoded and various code rate data is charted against $E_b/N_o$, where $E_b$ is the energy per bit and $N_o$ is the Gaussian White Noise energy per bit. The coding gain at any point along a bit error performance curve for a particular BER level is determined by subtracting the coded $E_b/N_o$ from the uncoded $E_b/N_o$. In the paper "Viterbi Decoding for Satellite and Space Communication", by J. A. Heller and I. M. Jacobs, IEEE Transactions on Communication Technology, Vol. COM-19, pgs. 835-848, October 1971, extensive results of simulations on various decoder apparatus were reported.

The coding rate and constraint length are used to define the Viterbi decoder. The coding rate (m/n) corresponds to the number of coding symbols produced (n) for a given number of input bits (m). The coding rate of ½ has become one of the most popular rates, although other code rates are also generally used. One class of codes with m≠1 are called punctures codes and are produced by discarding or erasing symbols from the rate 1/n code. The constraint length (K) is the length of the convolutional code used in the encoding of the data. A constraint length of K=7 is typical in convolutional coding schemes. The convolutional encoder can be thought of as an Finite Impulse Response (FIR) filter with binary coefficients and length K−1. This filter produces a symbol stream with $2^{K-1}$ possible states.

The basic principal of the Viterbi algorithm is to take a convolutionally encoded data stream that has been transmitted over a noisy channel and use the properties of the convolutional code to determine the transmitted bit stream. The Viterbi algorithm is a computationally efficient method of updating the conditional probabilities of the best state and the most probable bit sequence transmitted from the possible $2^{K-1}$ states. In order to compute this probability, all $2^{K-1}$ states for each bit must be computed. The resulting decision from each of these computations is stored as a single bit in a path memory.

A chainback operation, an inverse of the encoding operation, is performed in which the $2^{K-1}$ decision bits are used to select an output bit. After many states the most probable path will be selected with a high degree of certainty. The path memory depth must be sufficiently long to allow this probability to approach 1. For a rate ½ code, an exemplary path memory depth is about (5·K), or 35 states. For a rate ⅞ punctured code the optimal depth increases to 96 states.

Constraint lengths of K less than 5 are too small to provide any substantial coding gain, while systems with K greater than 7 are typically too complex to implement as a parallel architecture on a single VLSI device. As the constraint length increases, the number of interconnections in a fully parallel computation section increases as a function of $(2^{K-1} \cdot L)$, where L is the number of bits of precision in the state metric computations. Therefore, where K is greater than 7, serial computation devices are generally used which employ large external random access memories (RAMs).

In the paper "Channel Coding with Multilevel/Phase Signal" by G. Ungerboeck, IEEE Transactions on Information Theory, Vol. IT-28, pgs. 55-67, January 1982, a trellis coded modulation (TCM) was described. In Ungerboeck it was shown that within a given spectral bandwidth, it is possible to achieve an Asymptotic Coding Gain of up to 6 dB by employing a rate (k−1)/k convolutional code and doubling the signal set. Unfortunately for each modulation technique and for each bit rate, the maximal coding again is achieved by a different convolutional code. Further disclosed were the results of a search for all convolutional codes for several rates and modulation techniques, and the best codes presented.

In the paper "A Pragmatic Approach to Trellis-Coded Modulation" by A. J. Viterbi, J. K. Wolf, E. Zehavi and R. Padovani, IEEE Communications Magazine, pgs. 11-19, July 1990, a pragmatic approach to trellis coded modulation (PTCM) was disclosed. The underlying concept therein is that a somewhat lower coding gain is achievable by a PTCM based on the "industry standard" rate ½, K=7 convolutional code. Although a lower coding gain is realized, it is very close to the coding gain of Ungerboeck at BERs of interest.

Trellis coding is an attractive coding technique since it possesses an aspect which other coding techniques lack. The power of trellis coding lies in the fact that even though no apparent coding operation is performed on any other bit than the least significant bit of the input data, the decoder is able to provide error correction on all bits. Generally the use of TCM techniques to achieve efficient use of power-bandwidth resources has been limited to low speed applications in digital signal processor implementations. The use of PTCM techniques enable VLSI implementations of an encoder/decoder capable of operating at high rates. A decoder using PTCM techniques is capable of handling different modulation techniques, such as M-ary phase-shift keying (M-ary PSK) including Binary PSK (BPSK), Quadrature PSK (QPSK), 8-PSK, and 16-PSK.

In any phase modulation system, a stable reference is required for coherent demodulation at the receiver. However in a M-ary PSK system, where there is no absolute phase reference, phase ambiguities in the transmitted data may occur in the transmission channel which must be resolved for proper decoding of the received data. Such phase ambiguities, or phase shifts, in the received data can be on the order of $2\pi/M$, $4\pi/M, \ldots, (M-1)(2\pi/M)$. All phase ambiguities other than integer multiples $4\pi/M$ can be resolved by known techniques, typically monitoring the growth rate of the state metrics in the Viterbi decoder. However, such techniques do not enable resolution of the phase ambiguities that are integer multiples $4\pi/M$. Therefore, the power of trellis coding has been unavailable to high speed data communication systems using M-ary PSK modulation.

It is therefore an object of the present invention to provide a novel method and system for resolving, in an M-ary PSK communication system, phase ambiguities of trellis coded modulated data that are integer multiples $4\pi/M$.

SUMMARY OF THE INVENTION

The present invention is a novel and improved method and apparatus which utilizes trellis coding in the encoding and decoding of data. In accordance with the present invention an encoder and a decoder are disclosed which overcome the problems of transmission phase ambiguities in M-ary PSK modulation when using trellis coded data.

The encoder receives sets of input data bits, differentially encodes one input data bit of each set and then convolutionally encodes the resultant bit to produce corresponding symbols. In an 8-PSK modulation scheme each set is comprised of two bits while in a 16-PSK modulation scheme each set is comprised of three bits. For 8-PSK modulation the other input data bit from each set of input data bits is directed onto one of two data paths in accordance with the state of the most significant symbol resulting from the convolutional encoding. For 16-PSK modulation the other input data bits from each set of input data bits are directed onto one of two data paths in accordance with the state of the most significant symbol resulting from the convolutional encoding. The data on each data path are independently differentially encoded then remerged into a single output bit stream. The convolutional encoded symbols and the corresponding remerged bit, or bits in the case of 16-PSK modulation, form a signal or phase point used in carrier modulation. In the preferred mapping scheme the least significant bits of the phase point is comprised of the convolutional encoder output while the more significant bits are comprised of the resultant multiplexed differential encoded bits.

The decoder uses a Viterbi decoder and differential decoder to generate an error corrected estimate of the corresponding one bit of the original data. The Viterbi decoder uses branch metrics in the decoding process developed from information contained in the phase of the received signal. The Viterbi decoder output bit is also convolutionally encoded to produce corresponding symbols for use in the recovery of the other corresponding bits. In the case of 8-PSK modulation each most significant data bit is directed onto one of two data paths in accordance with the state of the most significant symbol of the convolutionally re-encoded symbol pair output. Similarly, in the case of 16-PSK modulation the most significant bits of each data bit pair are directed into one of two data bit pair paths in accordance with the state of the most significant symbol of the convolutionally re-encoded symbol pair output. In both cases the data on the two paths are independently differentially decoded then remerged into a single output bit stream. Output from the encoder are the recovered one data bit and other bit, or bits, of the original input data.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

Figure 1:
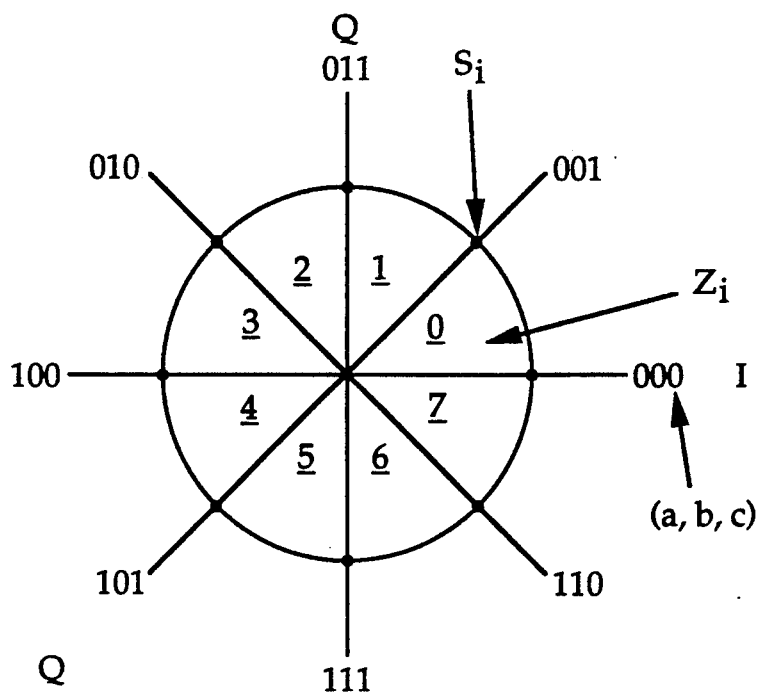
FIG. 1 is a graph illustrating the signal space for 8-PSK modulation.

Referring now the drawings, FIG. 1 illustrates the signal space for 8-PSK modulation for trellis coded data. The signals used in 8-PSK modulation are proportional to:

$$S_i = \sin\left(\frac{\pi i}{4}\right) \quad (1)$$

for $i = 0, 1, \ldots, 7$, where the signal space is defined by eight sectors $Z_i$ such that the signal $S_i$ falls at the beginning of a sector $Z_i$. In FIG. 1, the sectors $Z_i$ are numbered as indicated by the corresponding underlined numeral within each sector. The phase of any point within sector $Z_i$ can be expressed by the following relationship:

$$\frac{\pi i}{4} \leq \phi < \frac{\pi(i+1)}{4} \quad (2)$$

for $i = 0, 1, \ldots, 7$.

In the 8-PSK modulation scheme, each sector $Z_i$ in which the signal $S_i$ corresponds is represented by a three-bit sector value (a, b, c) representative of that sector according to the exemplary mapping scheme illustrated in FIG. 1. In other words, the bit value a which is the most significant bit of the sector value identifies the half plane, while the bits (b, c) identify the sector within the half plane. As an illustration of the mapping scheme in FIG. 1, a three-bit sector value of 111 would be indicative of a signal corresponding to sector number 6 ($Z_6$) and would be transmitted as a carrier phase shift of 270°. Similarly a carrier signal received having a phase shift of 270° would also correspond to a sector value of 111, provided no phase shift is experienced in the transmission channel.

Figure 4:
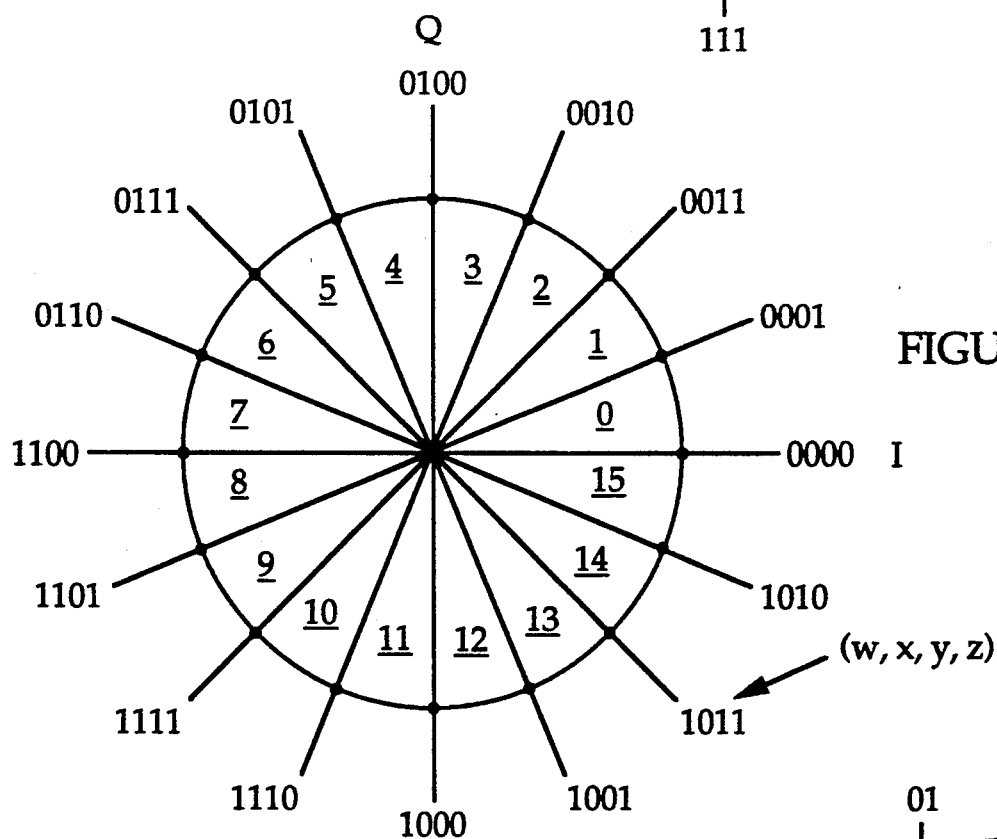
FIG. 4 is a graph illustrating the signal space for 16-PSK modulation.

It should be understood that each sector value corresponds to one sector, or wedge, of the IQ planes of FIGS. 1 and 4. It is critical to understand that the sector values are not the same as traditional "decision regions". The sector value for a given sector corresponds to the three-bit value for 8-PSK, or four-bit value for 16-PSK, mapped to the phase point bordering the sector on the side clockwise from the center of the sector.

Decision regions are generally centered on the transmitted phase points, while in this discussion sectors are immediately counterclockwise from the phase points. Decision regions normally associated with PSK modem designs are not relevant to the present discussion.

As mentioned previously, phase ambiguities in the received carrier may result from phase shifts in the transmission channel. In the case of 8-PSK modulation where trellis coded modulation of data is used, phase ambiguities that are integer multiples $\pi/2$ need to be resolved by techniques previously unknown. The encoder and decoder as disclosed herein utilizes techniques which enable the resolution of such phase ambiguities.

In a communication system which utilizes TCM with M-ary PSK modulation without an absolute phase reference, the receiver (decoder) phase can differ from the transmitter (encoder) phase, i.e. a phase shift in the transmitted data with respect to the received data, as discussed above. In the case of 8-PSK modulation, the receiver may differ from the transmitter phase by 0°, 45°, 90°, 135°, 180°, 225°, 270° or 315°. The phase shifts of 45°, 135°, 225° and 315° are detected by a Viterbi or convolutional decoder at the receiver since in these cases the effective error rate of the channel in the absence of noise is 50%. One technique used for detecting these particular phase shifts is monitoring the growth of the state metrics, i.e. the normalization rate of the state metrics is abnormally high. Upon detecting this phase condition, correction may be made by shifting the branch metrics, such as by simply stepping ahead by $\pi/4$ in the signal space.

However, phase shifts of 90°, 180° and 270° are undetected by the Viterbi decoder and thus other means must be utilized to correct for these conditions. Table I illustrates the transmitted data and corresponding received data for phase shifts in increments of 90°. Since only a phase shift of 90°, 180°, and 270° and no other noise is assumed in this discussion, the symbols $(\hat{a},\hat{b},\hat{c})$ can be used to refer to either the received phase point or the corresponding sector value.

TABLE I

| TRANSMITTED BITS (a, b, c) | RECEIVED BITS $(\hat{a},\hat{b},\hat{c})$ | | |
|---|---|---|---|
| 0° | 90° | 180° | 270° |
| 000 | 011 | 100 | 111 |
| 001 | 010 | 101 | 110 |
| 011 | 100 | 111 | 000 |
| 010 | 101 | 110 | 001 |
| 100 | 111 | 000 | 011 |
| 101 | 110 | 001 | 010 |
| 111 | 000 | 011 | 100 |
| 110 | 001 | 010 | 101 |

From Table I, it can be seen that the two least significant bits of the received phase point, bits $\hat{b}$, and $\hat{c}$ which are coded with a transparent convolutional code, are always either the right sense or inverted when a phase shift is experienced in the transmission channel. The use of a standard binary differential encoder just prior to the convolutional encoder in the TCM encoder and after the Viterbi decoder in the TCM decoder will correct the phase ambiguities in these two least significant bits. However, the affect of a phase shift on the most significant bit of the phase point as received, bit $\hat{a}$ is a more difficult problem to overcome, particularly for phase shifts of 90° and 270° where it is not complemented consistently.

For a phase shift of 180° the coded bits $\hat{b}$ and $\hat{c}$ are correct while for phase shifts of 90° and 270° the coded bits $\hat{b}$ and $\hat{c}$ are mapped to their inverse with respect to the corresponding transmitted bits. As mentioned previously, the use of a differential encoder in the encoder and a differential decoder in the decoder will ensure that the received bits $\hat{b}$ and $\hat{c}$ are correct.

For 8-PSK modulation, the Viterbi decoder produces an estimate $\hat{a}'$ of the most significant bit a of the transmitted phase point along with the symbol $\hat{\delta}$, an estimate of $\delta$ discussed later herein. The manner of operation of the Viterbi decoder is the subject of a copending patent application entitled "Viterbi Decoder Bit Efficient Chainback Memory Method and Decoder Incorporating Same", filed Sep. 27, 1991; and, bearing U.S. patent application Ser. No. 07/767,167, and assigned to the Assignee of the present invention. In the noiseless case, $\hat{a}'$ is the same as $\hat{a}$.

With respect to the case of a 180° phase shift the uncoded bit, bit $\hat{a}$ is always inverted with respect to the corresponding transmitted bit, while for phase shifts of 90° and 270° only certain ones of the uncoded bit $\hat{a}$ are inverted. For purposes of illustration in Table I, each occurrence of an inverted uncoded bit $\hat{a}$ is highlighted. Whether or not the uncoded bit $\hat{a}$ is inverted can be identified by the middle bit, bit $\hat{b}$, of the three bits $(\hat{a},\hat{b},\hat{c})$. Although an error corrected version of the bit $\hat{b}$ is preferably used, bit $\hat{b}'$, Table I for purposes of illustration considers bit $\hat{b}$ to not need correction and be the same as the error corrected bit $\hat{b}'$.

Referring to Table I, in the case of a 90° phase shift the uncoded bit $\hat{a}$ is inverted when the error corrected version of the coded middle bit $\hat{b}$ is a "0". The uncoded bit $\hat{a}$ is unchanged when the error corrected version of the coded middle bit $\hat{b}$ is a "1". In the case of a 180° phase shift the uncoded bit $\hat{a}$ is inverted regardless of the state of the error corrected version of the coded middle bit $\hat{b}$. In the case of a 270° phase shift the uncoded bit $\hat{a}$ is inverted when the error corrected version of the coded middle bit $\hat{b}$ is a "1". The uncoded bit $\hat{a}$ is unchanged when the error corrected version of the coded middle bit $\hat{b}$ is a "0".

Straight differential encoding of the uncoded bit $\hat{a}$ in the case of a phase shift of 180° will resolve the constant inversion. However, such a technique alone will not resolve inconsistent inversions in the uncoded bit $\hat{a}$ for phase shifts of 90° and 270°. In these cases the coded middle bit $\hat{b}$, preferably the error corrected version thereof, can therefore be used as an indicator of inversions as a supplement to differential encoding.

In the TCM encoder the coded middle bit b is used to split the stream of bits $a$ into two streams $a_1$ and $a_2$. Each of the two streams of uncoded bits $60_1$ and $a_2$ are differentially encoded with a standard binary differential encoder independently of each other. The coded middle bit b is then used to remerge the two differentially encoded bit streams $a_1$ and $a_2$ to produce each bit a.

In the TCM decoder the coded bits b and c are decoded using a Viterbi decoder for error detection and correction. One result of the Viterbi decoding, the bit $\hat{\delta}$, is then convolutional encoded to produce the bits $\hat{b}'$ and $\hat{c}'$. The bit $\hat{b}'$ is used to split the stream of most significant bits $\hat{a}'$ provided by the Viterbi decoder into two streams $a_1'$ and $A_2'$. Each of the two streams of uncoded bits $\hat{a_1}'$ and $\hat{a_2}'$ are differentially decoded with a standard binary differential decoder independently of each other to produce the corresponding bits streams $\hat{a}_1$ and $\hat{\alpha}_2$. The coded middle bit $\hat{b}'$ is then used to remerge the two differentially encoded bit streams $\hat{\alpha}_1$ and $\hat{\alpha}_1$ to produce each bit $\hat{a}$. This technique of separate bit stream differential encoding/decoding using the middle coded bit $\hat{b}'$ for differential encoder/decoder selection permits inversions in the bit $\hat{a}'$ to be resolved.

Figure 2:
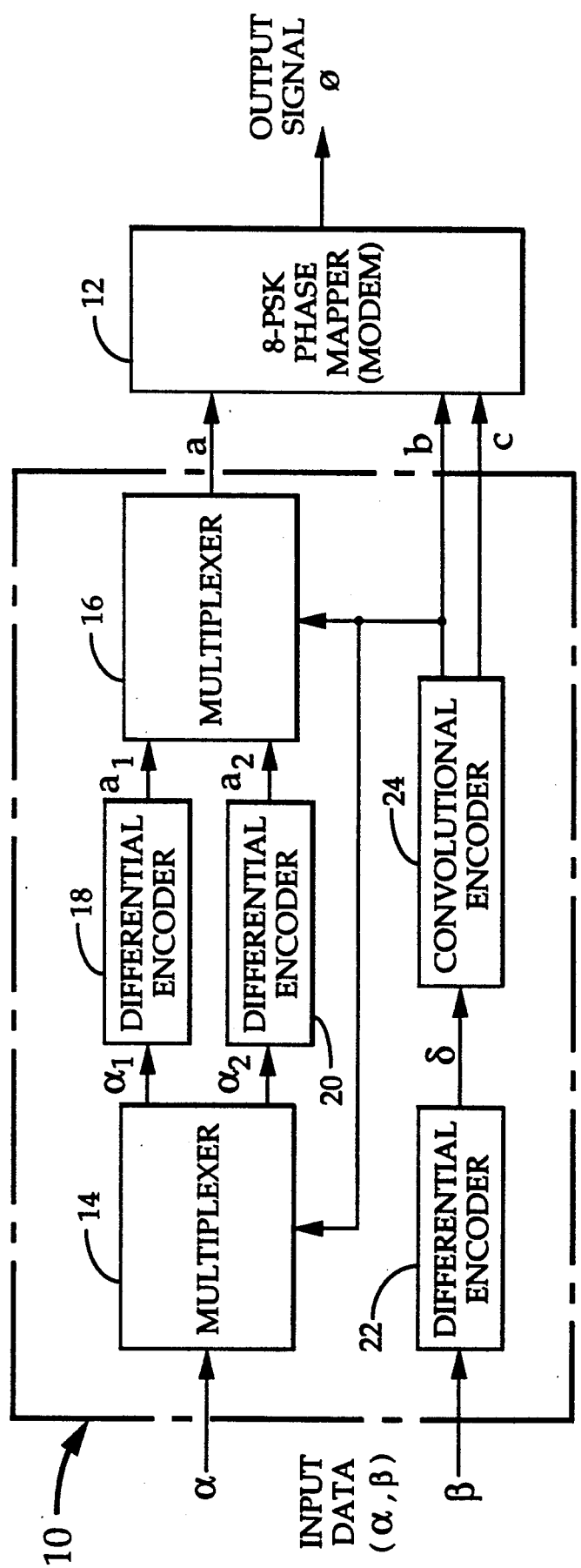
FIG. 2 is a block diagram of an exemplary embodiment of the encoder of the present invention for 8-PSK modulation.

In a communication system using trellis coded modulation, it is necessary to encode the data in a manner that also permits a decoding of the data while overcoming the phase ambiguities caused by the transmission channel. Accordingly, FIG. 2 illustrates an exemplary embodiment of a trellis coded modulation (TCM) encoder 10 of the present invention configured for 8-PSK modulation where no phase reference is provided. Encoder 10 receives two bits of input data $(\alpha,\beta)$ and generates a corresponding three-bit phase point value (a,b,c).

The phase point value is output from encoder 10 to an 8-PSK phase mapper or modem 12 where the phase of a carrier signal if shifted in accordance with the data sector mapping scheme of FIG. 1. The output of modem 12 is the phase shifted carrier signal ($\phi$) where:

$$\phi = A \cos(2\pi f_c t + \theta). \quad (3)$$

where:
A is the signal amplitude (typically a constant),
$f_c$ is the carrier frequency, and
$\theta$ is the phase offset corresponding to the sector value, and where:

$$\theta = (a \cdot 180°) + (b \cdot 90°) + ((b-c)^2 \cdot 45°). \quad (4)$$

Modem 12 may be configured as a conventional phase shift keyed (PSK) digital transmission modem using phase shift techniques well known in the art. For example modem 12 is typically configured to transmit the carrier signal in the form according to equation (1). Using the well known trigonometry formula:

$$\cos(x+y) = (\cos x \cdot \cos y) - (\sin x \cdot \sin y) \quad (5)$$

a QPSK modem structure may be implemented using an I and Q constellation corresponding to FIG. 1 to represent the carrier phase shift where:

$$I = \cos \theta, \quad (6)$$

$$Q = -\sin \theta. \quad (7)$$

The I component is mixed directly with the carrier (cos $2\pi f_c t$) in a first mixer while the Q component is mixed with a 90° phase shifted carrier (sin $2\pi f_c t$) in a second mixer. The result of each signal mixing is summed in a summer to produce the signal $\phi$ where:

$$\phi = A \cos (2\pi f_c t + \theta) = (\cos \theta \cdot \cos 2\pi f_c t) - (\sin \theta \cdot \sin 2\pi f_c t) \quad (8)$$

or $$\phi = A \cos (2\pi f_c t + \theta) = (I \cdot \cos 2\pi f_c t) + (Q \cdot \sin 2\pi f_c t). \quad (9)$$

Modem 12 may also be configured to include circuitry for converting the baseband signal to RF frequencies, RF transmission circuitry and an antenna system as is well known in the art.

Encoder 10 in an exemplary form is comprised of multiplexers 14 and 16; differential encoders 18, 20 and 22; and convolutional encoder 24. Encoder 10 is preferably of a VLSI construction with the elements thereof individually of conventional design. Data is input to encoder 10 two bits at a time, bits $(\alpha,\beta)$, with bit $\alpha$ input to multiplexer 14, and bit $\beta$ input to differential encoder 20.

In each two-bit input of data, bits $(\alpha,\beta)$, the bit $\beta$ is input to differential encoder 22 where it is differentially encoded. Techniques for the differential encoding of bit $\beta$, along with circuit designs for differential encoders are well known in the art. Each differentially encoded bit or symbol ($\delta$) corresponding to an input bit $\beta$ is output from differential encoder 22 is an input to convolutional encoder 24. Convolutional encoder 24 in the exemplary embodiment is a rate $\frac{1}{2}$, K=7 convolutional encoder which convolutionally encodes each input bit $\delta$ so as to provide two corresponding output bits or symbols (b, c). Techniques for the convolutional encoding of bit $\delta$, along with circuit designs for convolutional encoders, are well known in the art. The bits (b, c) output from encoder 10 are provided as inputs to modem 12.

The most significant bit, bit b, of the bit pair (b, c) is also output from encoder 24 as a select signal to a select input to each of multiplexers 14 and 16. Multiplexer 14 is typically a 1:2 multiplexer which provides data presented at a data input thereof to a selected one of two outputs in accordance with the state of the select signal provided at the select input thereof. In this particular case, the data presented at the input of multiplexer 14 is the bit $\alpha$ of the current bit pair $(\alpha,\beta)$. With the select signal input coupled to the bit b output of convolutional encoder 24, the state of the bit b generated from bit $\beta$ of the current bit pair $(\alpha,\beta)$ determines at which output of multiplexer 14 the bit $\alpha$ is presented. When the bit b state is in one logic state, for example a logical "0", the bit $\alpha$ is output from multiplexer 14 at a first output as the bit $\alpha_1$. Similarly, when the bit b state is in the other logic state, for example a logical "1", the bit $\alpha$ is output from multiplexer 14 at a second output as the bit $\alpha_2$. In essence, the stream of bits $\alpha$ is broken into two bit streams according to the state of the most significant bit, bit b, of the bit pair (b, c) output from convolutional encoder 24.

Each output of multiplexer 14 is coupled to a respective input of differential encoders 18 and 20. The bit $\alpha_1$ is therefore provided to differential encoder 18 while the bit $\alpha_2$ is respectively to differential encoder 20. Differential encoders 18 and 20 each differentially encode the respectively received bit $\alpha_1$ or $\alpha_2$ with respect to a correspondingly previously received bit. The different encoding of the bits $\alpha_1$ and $\alpha_2$ can be accomplished by any of the techniques well known in the art. Differential encoders 18 and 20 are thus each exercised only when a new input bit is provided thereto. Each of differential encoders 18 and 20 input bit is provided thereto. Each of differential encoders 18 and 20 respectively provide an output bit $a_1$ or $a_2$ for each corresponding bit $\alpha_1$ or $\alpha_2$ received. The bits $a_1$ or $a_2$ are respectively provided from differential encoders 18 and 20 to separate data inputs of multiplexer 15.

Multiplexer 16 is typically a 2:1 multiplexer which, in accordance with a select signal provided at a select input, provides data at an output selected from data presented at two inputs. The bits $a_1$ and $a_2$ as presented at the inputs of multiplexer 16 are provided at the output of multiplexer 16, as the bit or symbol a. The bit a is determined in accordance with the state of the bit b generated from bit $\beta$ of the current bit pair $(\alpha,\beta)$. In essence, the bit streams $a_1$ and $a_2$ are merged into a single bit stream corresponding to the most significant bit, bit b, of the bit pair (b, c) output from convolutional encoder 24.

The bit a is provided, along with the bits b and c, at respective inputs of modem 12. Modem 12 assembles the data bits a, b and c in order with the bits a and c respectively being the most significant and least significant bits of a three-bit phase point value. Modem 12 provides the shifted phase carrier signal ($\phi$) as discussed above.

Figure 3:
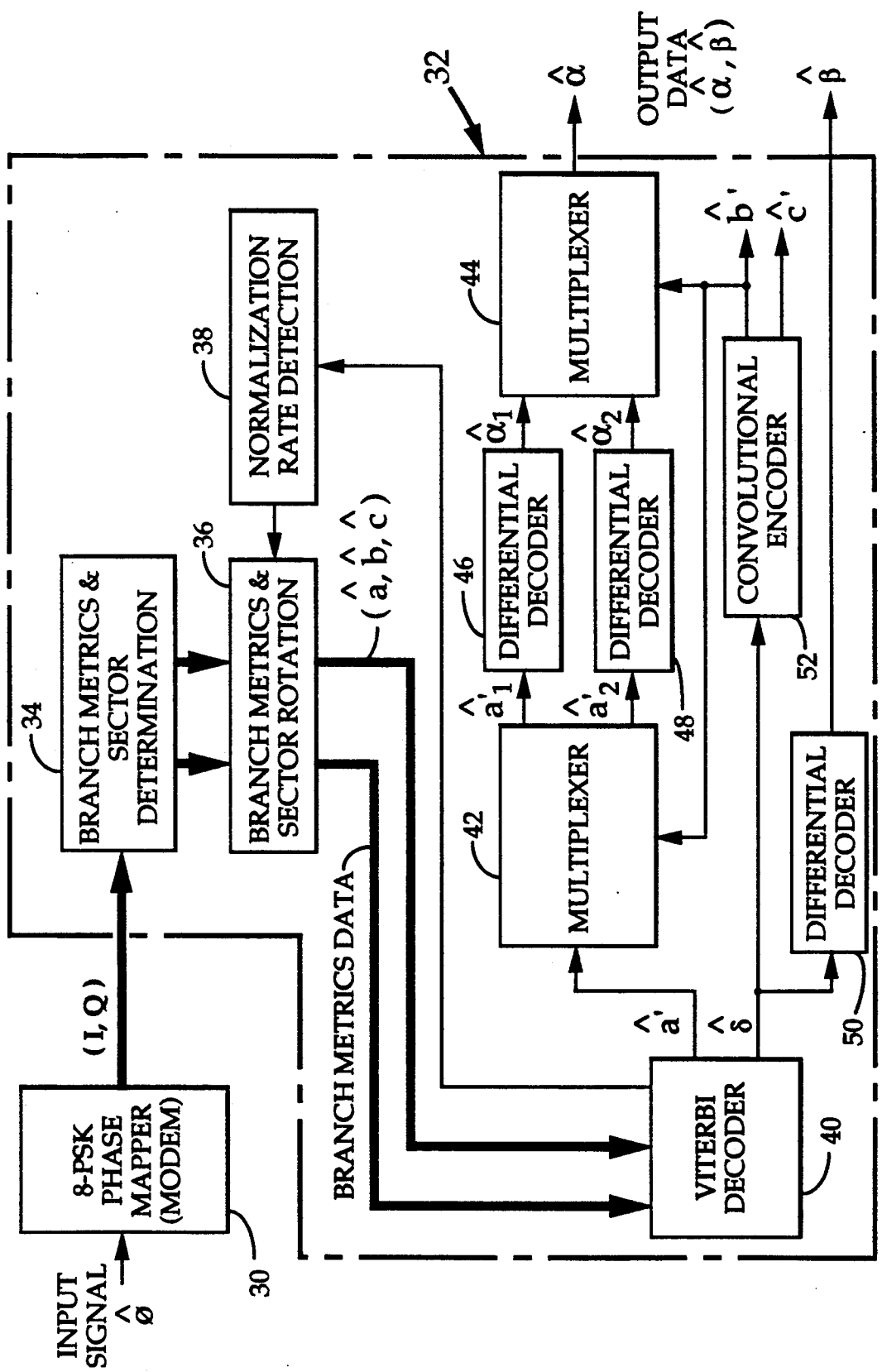
FIG. 3 is a block diagram of an exemplary embodiment of the decoder of the present invention for data encoded by the encoder of FIG. 2.

FIG. 3 illustrates an exemplary embodiment of a modem 30 and TCM decoder 32 of the present invention configured for demodulation of an 8PSK signal where no phase reference is provided. Modem 30 receives the phase shifted carrier signal $\hat{\phi}$ which contains information in the form of the phase shift in the carrier. However channel conditions may arise which can result in a phase shift in the transmitted signal $\phi$. The received signal $\hat{\phi}$ may be expressed by the following equation:

$$\hat{\phi} = \hat{A} \cos(2\pi f_c t + \hat{\theta}) = \hat{A} \cos(2\pi f_c t + \theta + \Psi) \quad (10)$$

where $\Psi$ is the phase shift induced by the transmission channel.

Modem 30 converts the received signal $\hat{\phi}$ to quantized I and Q components where:

$$\hat{\theta} = \hat{I} \cos(2\pi f_c t) + \hat{Q} \sin(2\pi f_c t). \quad (11)$$

The I and Q components are provided to decoder 32 where converted to a three-bit sector value (â,b̂,ĉ). The sector value (â,b̂,ĉ) is again related to the phase of the received signal in accordance with equations (3) and (4). Modem circuitry and techniques well known in the art may be utilized to convert the phase of the received signal to I and Q components. Modem 30 may further include an antenna system, RF circuitry and frequency downconversion circuitry necessary to convert the received signal to baseband as is well known in the art.

Modem 30 provides an output of the I and Q components to decoder 32 for decoding and error correction. Decoder 32 is comprised of branch metrics and sector determination circuitry 34; branch metrics and sector rotation circuitry 36; normalization rate detection circuitry 38; Viterbi decoder 40; multiplexers 42 and 44; differential decoders 46, 48 and 50; and convolutional encoder 52. With the exclusion of circuitry 34 and 38, decoder 32 is also preferably of a VLSI construction with the elements thereof of conventional design. Although circuitry 34 and 38 may also be provided on a single VLSI chip, it is preferred that these elements be provided separately to enable flexibility for the end user and be of a conventional design. It should also be understood that convolutional encoder 52 may be integrated within Viterbi decoder 40.

The I and Q components are provided to determination circuitry 34 which typically includes an arctangent lookup table (not shown) typically implemented as a read only memory storing values of $\hat{\theta}$. The value of $\hat{\theta}$ is provided to a sector value and branch metric lookup table (not shown), also typically a read only memory, which stores a three-bit sector value along with the branch metrics corresponding to each value of $\hat{\theta}$. The sector value and branch metrics are output from determination circuitry 34 to rotation circuitry 36.

Rotation circuitry 36 rotates the three-bit sector value and corresponding branch metrics in the event of a detection by detection circuitry 38 of an usually high normalization rate in Viterbi decoder 40. In the 8-PSK system, a rotation corresponding to a 45° shift in the sector value and related branch metrics is performed. Rotation circuitry 36 may again be configured as a lookup table which is responsive to a signal from detection circuitry 38 for shifting the sector value and branch metrics. Further details on this rotation is discussed below.

Rotation circuitry 36 also contains a delay element (not shown) for providing a delay in the propagation of the sector value as output from rotation circuitry 36 due to the computational time required by the Viterbi decoder 40.

Using the branch metrics and the sector values (â,b̂,ĉ), rotated if necessary, decoder 40 produces best estimates of $\delta$ and a, respectively denoted as $\hat{\delta}$ and â'. In the decoding process a simplification in the actual decoding may be used that is the subject of the previously mentioned copending application.

Decoder 40 as previously mentioned also provides an output of normalization data which is used by normalization rate detection circuitry 38 to detect a high normalization rate indicative of channel phase shifts of 45°, 135°, 225° and 315°. Upon detection of a high normalization rate, detection circuitry 38 provides a control signal to rotation circuitry 36 which in response thereto provides a shift in the branch metrics corresponding to a shift in the signal space of $\pi/4$, along with a corresponding shift in the sector value bits (â,b̂,ĉ). Such a shift in the sector value results in the sector value corresponding to a phase shift of 0°, 90°, 180° and 270°. At each one of these phase shifts the Viterbi decoder is capable of recovering data. However, for cases other than a 0° phase shift, the 0° case being one in which the data is not corrupted by a channel phase shift, the Viterbi decoder is not capable of detecting that the data is in error as a result of a channel phase shift. The Viterbi decoder would therefore produce erroneous estimates of the original data. The present invention augments the Viterbi decoder so as to permit the resolution of phase ambiguity errors in the data caused by a channel phase shift.

Decoder 40 provides an output of the bit $\hat{\delta}$ as an input to both differential decoder 50 and convolutional encoder 52. Since the bit $\hat{\delta}$ was differentially encoded prior to convolutional encoding on the transmit end, on the receive end the differential encoding on the bit $\hat{\delta}$ must be decoded to recover the bit $\hat{\beta}$. The bit $\hat{\beta}$ is an estimate of the originally encoded bit $\beta$.

In order to recover an estimate of the transmitted bit $a$, designated by $\hat{a}$, the bit stream of â' must be broken into two bit streams with each bit stream independently differentially decoded then recombined into a single bit stream. The breaking of the bit stream into two bit streams and recombining is similar in manner to that of the encoder of FIG. 2. Control over the separation and combining of the broken bit stream is provided by the middle bit of the sector value. However, since errors may occur in the middle bit position of the sector value as received, i.e. in bit b̂, it is preferred that this error be corrected prior to usage of the bit in decoding the bit stream â'. Therefore the bit $\hat{\delta}$, which corresponds indirectly to a corrected sector value, is convolutionally encoded to produce the bits (b̂',ĉ').

An alternative to re-encoding the bit $\hat{\delta}$ to obtain the bits (b̂',ĉ'), from which the bit b̂' is used as discussed above, one could obtain a less reliable estimate of these bits directly from the I and Q inputs. Use of the bit b̂' generated from error corrected data from Viterbi decoder 40, results in a reduction in errors in this bit with respect to a corresponding bit generated directly from the I and Q components.

Using the preferred technique it should be realized that since the bits (b̂′,ĉ′) are estimates of the originally transmitted bits (b,c) that errors in these estimates may occur. An error in the bit b̂′ would result in a maximum of three errors in the bit â. However using the preferred re-encoding technique results in a minimization of the possible number of errors in the bit â.

Accordingly, the bit δ̂ output from decoder 40 is also provided as an input of convolutional encoder 52 so as to produce bits b̂′, ĉ′ which are corrected estimates of the transmitted phase point bits (b,c). The most significant bit (b̂′) of the bit pair (b̂′,ĉ′) is output from convolutional encoder 52 as a select signal to a select input of each of multiplexers 42 and 44. Although the bit ĉ′ is also produced by convolutional encoder 52 this bit is not used.

Multiplexer 42 is typically a 1:2 multiplexer which provides data presented at a data input thereof to a selected one of two outputs in accordance with the state of the select signal provided at the select input thereof. In this particular case, the data presented at the input of multiplexer 42 is the bit â′ from the Viterbi decoder. With the select signal input coupled to the bit b̂′ output of convolutional encoder 52, the state of the bit b̂′ generated from bit δ̂ determines at which output of multiplexer 42 the bit â′ is presented. When the bit b̂′ state is in one logic state, for example a logical "0", the bit â′ is output from multiplexer 42 at a first output as the bit â′$_1$. Similarly, when the bit b̂′ state is in the other logic state, for example a logical "1", the bit â′ is output from multiplexer 42 at a second output as the bit â′$_2$. In essence, the bit stream â′ is broken into two bit streams according to the state of the most significant bit, bit b̂′ of the bit pair (b̂′,ĉ′) output from convolutional encoder 52.

Each output of multiplexer 42 is coupled to a respective input of differential decoders 46 and 48. The bit â′$_1$ is therefore provided to decoder 46 while the bit â′$_2$ is respectively to decoder 48. Differential decoders 46 and 48 each differentially decode the respectively received bit â′$_1$ or â′$_2$ with respect to a correspondingly previously received bit. The differential decoding of the bits â′$_1$ and â′$_2$ can be accomplished by any of the techniques well known in the art. Differential decoders 46 and 48 are thus each exercised only when a new input bit is provided thereto. Each of differential decoders 46 and 48 respectively provide an output bit â$_1$ or â$_2$ for each corresponding input bit â′$_1$ or â′$_2$. The bits â$_1$ or â$_2$ are respectively provided from differential decoders 46 and 48 to separate data inputs of multiplexer 44.

Multiplexer 44 is typically a 2:1 multiplexer which, in accordance with a select signal provided at a select input, provides data at an output selected from data presented at two inputs. The bits â$_1$ and â$_2$ as presented at the inputs of multiplexer 44 are provided at the output of multiplexer 44, as the bit â. The bit â$_1$ and â$_2$ selected for output is determined in accordance with the state of the bit b̂′ generated from bit δ̂. In essence, the bit stream â$_1$ and â$_2$ is merged into a single bit stream â corresponding to the most significant bit, bit b̂′, of the bit pair (b̂′,ĉ′) output from convolutional encoder 52.

Turning now to the case of 16-PSK modulation, FIG. 4 illustrates the signal space and corresponding data mapping. In FIG. 4, the signal space is defined by sixteen sectors with the signal falling at the beginning of a sector. In the 16-PSK modulation scheme, each sector to which a signal corresponds is represented by a four-bit sector value (w,x,y,z).

In the case of 16-PSK modulation, the receiver may differ from the transmitter phase by 0°, 22.5°, 45°, 67.5°, 90°, 112.5°, 135°, 157.5°, 180°, 202.5°, 225°, 247.5°, 270°, 292.5°, 315°, or 337.5° are detected at the receiver by a Viterbi decoder since in these cases the effective error rate of the channel in the absence of noise is again 50%. Again a technique used for detecting these particular phase shifts is monitoring the growth of the state metrics, i.e. the normalization rate of the state metrics is abnormally high. Upon detecting this phase condition, correction may be made by shifting the branch metrics, such as by simply stepping ahead by $\pi/8$ in the signal space.

However, phase shifts of 45°, 90°, 135°, 180°, 225°, 270° and 315° are undetected by the Viterbi decoder and thus other means must be utilized to correct for these conditions. Table II illustrates the transmitted data and corresponding received data for phase shifts in increments of 45°. Since only a phase shift of 45°, 90°, 135°, 225°, 270° and 315° and no other noise is assumed in this discussion, the symbols (ŵ,x̂,ŷ,ẑ) can be used to refer to either the received phase point or the corresponding sector value.

TABLE II

| TRANSMITTED BITS (w, x, y, z) | RECEIVED BITS (ŵ, x̂, ŷ, ẑ) | | | | | | |
|---|---|---|---|---|---|---|---|
| 0° | 45° | 90° | 135° | 180° | 225° | 270° | 315° |
| 0000 | 1011 | 1000 | 1111 | 1100 | 0111 | 0100 | 0011 |
| 0001 | 1010 | 1001 | 1110 | 1101 | 0110 | 0101 | 0010 |
| 0011 | 0000 | 1011 | 1000 | 1111 | 1100 | 0111 | 0100 |
| 0010 | 0001 | 1010 | 1001 | 1110 | 1101 | 0110 | 0101 |
| 0100 | 0011 | 0000 | 1011 | 1000 | 1111 | 1100 | 0111 |
| 0101 | 0010 | 0001 | 1010 | 1001 | 1110 | 1101 | 0110 |
| 0111 | 0100 | 0011 | 0000 | 1011 | 1000 | 1111 | 1100 |
| 0110 | 0101 | 0010 | 0001 | 1010 | 1001 | 1110 | 1101 |
| 1100 | 0111 | 0100 | 0011 | 0000 | 1011 | 1000 | 1111 |
| 1101 | 0110 | 0101 | 0010 | 0001 | 1010 | 1001 | 1110 |
| 1111 | 1100 | 0111 | 0100 | 0011 | 0000 | 1011 | 1000 |
| 1110 | 1101 | 0110 | 0101 | 0010 | 0001 | 1010 | 1001 |
| 1000 | 1111 | 1100 | 0111 | 0100 | 0011 | 0000 | 1011 |
| 1001 | 1110 | 1101 | 0110 | 0101 | 0010 | 0001 | 1010 |
| 1011 | 1000 | 1111 | 1100 | 0111 | 0100 | 0011 | 0000 |
| 1010 | 1001 | 1110 | 1101 | 0110 | 0101 | 0010 | 0001 |

From Table II, it can be seen that the two least significant bits of the received phase point, bits ŷ, and ẑ which are coded with a transparent convolutional code, are again always either the right sense or inverted when a phase shift is experienced in the transmission channel. The use of a standard binary differential encoder just prior to the convolutional encoder in the TCM encoder and after the Viterbi decoder in the TCM decoder will correct the phase ambiguities in these two least significant bits. However, the affect of a phase shift on the most significant bits of the phase point as received, bits ŵ and x̂, is a more difficult problem to overcome, particularly for phase shifts of 45°, 135°, 225° and 315° where one, both or neither of these bits are complemented.

For a phase shift of 90°, 180° and 270° the coded bits (ŷ,ẑ) are correct while for phase shifts of 45°, 135°, 225° and 315° the coded bits (ŷ,ẑ) are mapped to their inverse with respect to the corresponding transmitted bits. As mentioned previously the use of a differential encoder in the encoder and decoder will ensure that the received bits (ŷ,ẑ) are correct.

For 16-PSK modulation, the Viterbi decoder produces an estimate $(\hat{w}',\hat{x}')$ of the most significant bits (w,x) of the transmitted phase point along with the symbol $\hat{\zeta}$, an estimate of $\zeta$ discussed later herein. The manner of operation of the Viterbi decoder is the subject of the previously mentioned copending application. In the noiseless case, $(\hat{w}',\hat{x}')$ is the same as $(\hat{w},\hat{x})$.

Figure 5:
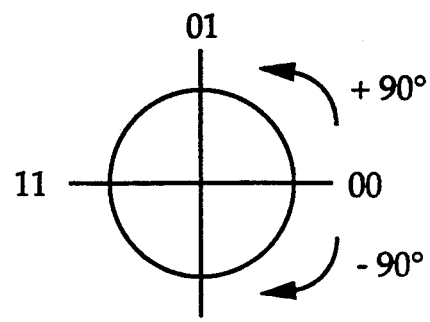
FIG. 5 is a graph illustrating a data map of the two most significant bits of data in 16-PSK modulation.

With respect to the phase shifts of 90°, 180° and 270°, the uncoded bits bits $(\hat{w},\hat{x})$ are both always shifted by a fixed amount of rotation with respect to the corresponding transmitted bits. Referring to FIG. 5, the uncoded bits $(\hat{w},\hat{x})$ may be represented by a Gray code. For phase shifts of 90°, 180° and 270° the uncoded bits are respectively rotated by a fixed amount, i.e. −90°, 180° and +90°, according to the mapping scheme of FIG. 5. However, for phase shifts of 45°, 135°, 225° and 270° a fixed amount of rotation is not present in the uncoded bits $(\hat{w},\hat{x})$.

For purposes of illustration in Table II, each occurrence of a rotated pair of uncoded bits $(\hat{w},\hat{x})$ is highlighted. In the case of phase shifts of 90°, 180° and 270° the fixed rotation is corrected for by using four-phase (4φ) differential encoding/decoding. Whether or not a rotation in the uncoded bits $(\hat{w},\hat{x})$ occurs, a rotation of the bits according to the map of FIG. 5, can be identified by the bit $\hat{y}$ of the four bits $(\hat{w},\hat{x},\hat{y},\hat{z})$. Although an error corrected version of the bit $\hat{y}$ is preferably used, bit $\hat{y}'$, Table II for purposes of illustration considers bit $\hat{y}$ to not need correction and be the same as the error corrected bit $\hat{y}'$.

Referring to Table II, in the case of a 45° phase shift the uncoded bits $(\hat{w},\hat{x})$ are rotated by −90° when the error corrected version of the coded bit $\hat{y}$ is a "1". The uncoded bits $(\hat{w},\hat{x})$ are unchanged when the error corrected version of the coded bit $\hat{y}$ is a "0". In the case of a 90° phase shift the uncoded bits $(\hat{w},\hat{x})$ are rotated by −90° regardless of the state of the error corrected version of the coded bit $\hat{y}$. In the case of a 135° phase shift the uncoded bits $(\hat{w},\hat{x})$ are rotated by 180° when the error corrected version of the coded bit $\hat{y}$ is a "1". The uncoded bits $(\hat{w},\hat{x})$ are rotated by −90° when the error corrected version of the coded bit $\hat{y}$ is a "0". In the case of a 180° phase shift the uncoded bits $(\hat{w},\hat{x})$ are rotated by 180° regardless of the state of the error corrected version of the coded bit $\hat{y}$.

In the case of a 225° phase shift the uncoded bits $(\hat{w},\hat{x})$ are rotated by +90° when the error corrected version of the coded by $\hat{y}$ is a "1". The uncoded bits $(\hat{w},\hat{x})$ are rotated by 180° when the error corrected version of the coded bit $\hat{y}$ is a "0". In the case of a 270° phase shift the uncoded bits $(\hat{w},\hat{x})$ are rotated by +90° regardless of the state of the error corrected version of the coded bit $\hat{y}$. And finally, in the case of a 315° phase shift the uncoded bits $(\hat{w},\hat{x})$ are unchanged when the error corrected version of the coded bit $\hat{y}$ is a "1". However, the uncoded bits $(\hat{w},\hat{x})$ are rotated by +90° when the error corrected version of the coded bit $\hat{y}$ is a "0".

Straight four-phase differential encoding of the uncoded bits $(\hat{w},\hat{x})$ in the case of phase shifts of 90°, 180° and 270° will resolve the rotation of the bits. However, such a technique alone will not resolve inconsistent rotations in the uncoded bits $(\hat{w}, \hat{x})$ for phase shifts of 45°, 135°, 225° and 315°. In these cases the coded bit $\hat{y}$, preferably the error corrected version thereof $(\hat{y}')$, can therefore be used as an indicator of rotation as a supplement to differential encoding.

In the TCM encoder the coded bit y is used to split the stream of bit pairs $(\eta,\epsilon)$, into a two separate streams of bit pairs $(\eta,\epsilon)_1$ and $(\eta,\epsilon)_2$. Each of the bit pair streams of uncoded bits $(\eta,\epsilon)_1$ and $(\eta,\epsilon)_2$ are differentially encoded with a standard four-phase differential encoder independently of each other. The coded bit y is then used to remerge the two differentially encoded bit streams $(\eta,\epsilon)_1$ and $(\eta,\epsilon)_2$ to produce the bits (w,x).

In the TCM decoder the coded bits $(\hat{y},\hat{z})$ are decoded using a Viterbi decoder for error detection and correction. The bit $\hat{\delta}$, resulting from the Viterbi decoding, is then convolutional encoded to produce the bits $\hat{y}'$ and $\hat{z}'$. The bit $\hat{y}'$ is used to split the stream of paired bits $(\hat{w}',\hat{x}')'$, also output from the Viterbi decoder, into two streams, $(\hat{w}',\hat{x}')_1$ and $(\hat{w}',\hat{x}')_2$. Each of the two streams of uncoded bits $(\hat{w}',\hat{x}')_1$ and $(\hat{w}',\hat{x}')_2$ are differentially decoded with a standard four-phase differential decoder independently of each other to produce the corresponding bits streams $(\hat{\eta},\hat{\epsilon})_1$ and $(\hat{\eta},\hat{\epsilon})_2$. The coded bits $\hat{y}'$ is then used to remerge the two differentially encoded bit streams $(\hat{\eta},\hat{\epsilon})_1$ and $(\hat{\eta},\hat{\epsilon})_2$ to produce the bits $\hat{\eta}$ and $\hat{\epsilon}$. This technique of separate bit stream differential encoding/decoding using the coded bit y' for differential encoder/decoder selection permits rotations in the bit pair $(\hat{w}',\hat{x}')$ to be resolved.

Figure 6:
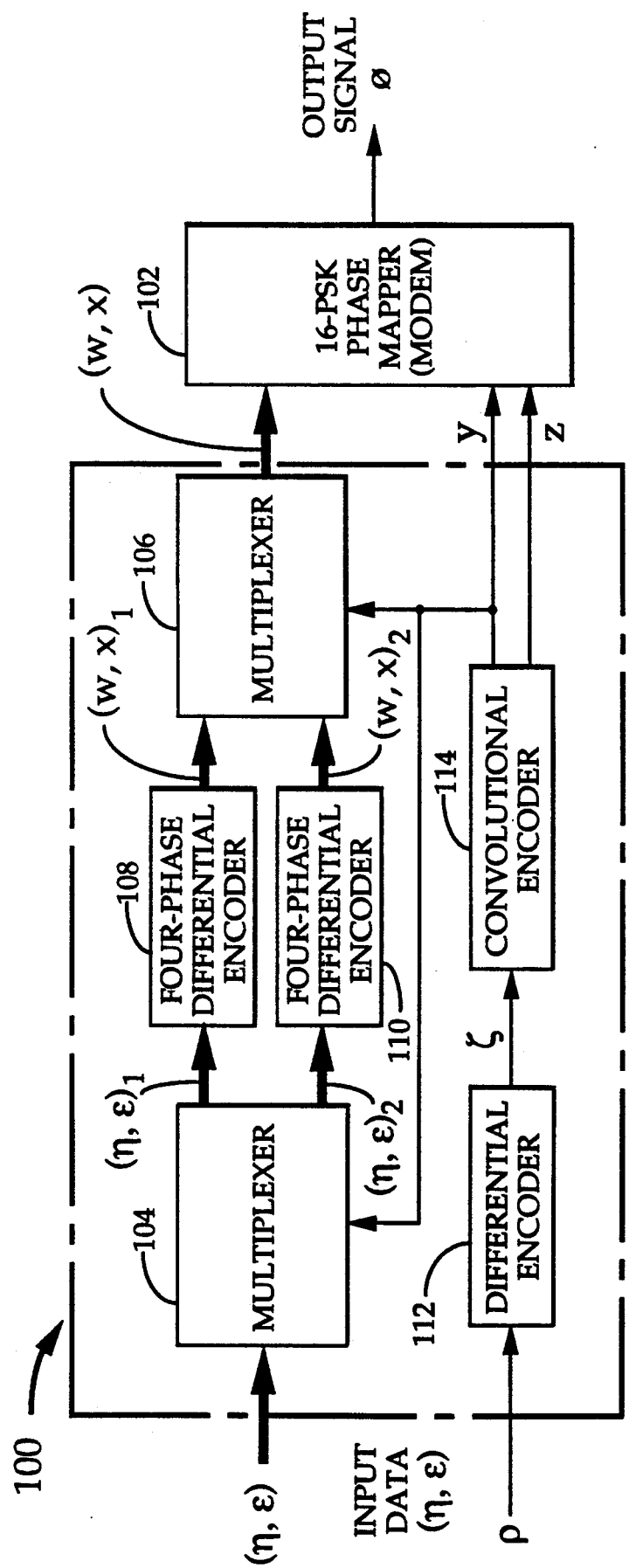
FIG. 6 is a block diagram of an exemplary embodiment of the encoder of the present invention for a 16-PSK modulation.

In a communication system using trellis coded modulation, it is necessary to encode the data in a manner that also permits a decoding of the data while overcoming the phase ambiguities caused by the transmission channel. Accordingly, FIG. 6 illustrates an exemplary embodiment of a trellis coded modulation encoder 100 of the present invention configured for 16-PSK modulation where again no phase reference is provided. Encoder 100 receives three bits of input data $(\eta,\epsilon,\rho)$ and generates the corresponding four-bit phase point value (w,x,y,z).

The phase point value is output from encoder 100 to a 16-PSK mapper or modem 102 where the phase of a carrier signal is shifted in accordance with the data sector mapping scheme of FIG. 4. The output of modem 102 is the phase shifted carrier signal (φ) where again:

$$\phi = A\cos(2\pi f_c t + \theta) \qquad (12)$$

where:
A is the signal amplitude (typically a constant),
$f_c$ is the carrier frequency, and
θ is the phase offset corresponding to the sector value, and
where:

$$\theta = (w \cdot 180°) + ((w-x)^2 \cdot 90°) + (y \cdot 45°) + ((y-z)^2 \cdot 22.5°). \qquad (13)$$

Modem 102 may be configured as a conventional phase shift keyed (PSK) digital transmission modem using phase shift techniques well known in the art.

Encoder 100 is an exemplary form is comprised of multiplexers 104 and 106; four-phase differential encoders 108 and 110; binary differential encoder 112; and convolutional encoder 114. Encoder 100 is preferably of a VLSI construction with the elements thereof individually of conventional design. Data is input to encoder 100 three bits at a time, bits $(\eta,\epsilon,\pi)$, with bits $(\eta,\epsilon)$ input to multiplexer 104, and bit $\pi$ input to differential encoder 112.

In each three-bit input $(\eta,\epsilon,\rho)$ each bit ρ is input to differential encoder 112 and differentially encoded with respect to a previously received bit ρ. Techniques for the differential encoding of bit ρ, along with circuit designs for differential encoders are well known in the art. Each differentially encoded bit or symbol ($\zeta$) corresponding to an input bit $\rho$ is output from differential encoder 112 as an input to convolutional encoder 114. Convolutional encoder 114 in the exemplary embodiment is a rate $\frac{1}{2}$, K=7 convolutional encoder which convolutionally encodes each input bit $\delta$ so as to provide two corresponding output bits or symbols (y, z). Techniques for the convolutional encoding of bit $\xi$, along with circuit designs for convolutional encoders, are well known in the art. The bits (y,z) output from encoder 100 are provided as inputs to modem 102.

The most significant bit, bit y, of the bit pair (y,z) is also output from convolutional encoder 114 as a select signal to a select input to each of multiplexers 104 and 106. Multiplexer 104 is typically a 1:2 multiplexer which provides data presented at a data pair input thereof to a selected one of two data pair outputs in accordance with the state of the select signal provided at the select input thereof. In this particular case, the data presented at the data pair input of multiplexer 104 are the bits ($\eta,\epsilon$) of the current bit group ($\eta,\epsilon,\rho$). With the select signal input coupled to the bit y output of convolutional encoder 114, the state of the bit y generated from bit $\rho$ of the current bit group ($\eta,\epsilon,\rho$) are presented. When the bit y state is in one logic state, for example a logical "0", the bit pair ($\eta,\epsilon$) are output from multiplexer 104 at a first output as the bit pair ($\eta,\epsilon$)$_1$. Similarly, when the bit y state is in the other logic state, for example a logical "1", the bit pair ($\eta,\epsilon$) are output from multiplexer 104 at a second output as the bit pair ($\eta,\epsilon$)$_2$. In essence, the stream of bit pairs ($\eta,\epsilon$) are broken into two bit streams according to the state of the most significant bit, bit y, of the bit pair (y, z) output from convolutional encoder 114.

Each bit pair output of multiplexer 104 is coupled to a respective bit pair input of differential encoders 108 and 110. The bit pair ($\eta,\epsilon$)$_1$ is therefore provided to differential encoder 108 while the bit pair ($\eta,\epsilon$)$_2$ is respectively to differential encoder 110. Differential encoders 108 and 110 each differentially encode the respectively received bit pairs ($\eta,\epsilon$)$_1$ or ($\eta,\epsilon$)$_2$ with respect to a correspondingly previously received bit pair. The differential encoding of the bit pairs ($\eta,\epsilon$)$_1$ or ($\eta,\epsilon$)$_2$ can be accomplished by any of the techniques well known in the art. Differential encoders 108 and 110 are thus each exercised only when a new input bit pair if provided thereto. Each of differential encoders 108 and 110 respectively provide an output bit pair (w, x)$_1$ or (w, x)$_2$ for each corresponding bit pair ($\eta,\epsilon$)$_1$ or ($\eta,\epsilon$)$_2$ received. The bit pairs (w, x)$_1$ and (w, x)$_2$ are respectively provided from differential encoders 108 and 110 to separate data pair inputs of multiplexers 106.

Multiplexer 106 is typically a 2:1 multiplexer which, in accordance with a select signal provided at a select input, provides data at a data pair output selected from data presented at two data pair inputs. The bit pairs (w, x)$_1$ and (w, x)$_2$ as presented at the data pair inputs of multiplexer 106 are provided at the data pair output of multiplexer 106, as the bit or symbol pair (w, x). The bit pair (w, x) is determined in accordance with the state of the bit y generated from bit $\pi$ of the current bit group ($\eta,\epsilon,\rho$). In essence, the bit pair streams (w, x)$_1$ and (w, x)$_2$ are merged into a single bit pair stream corresponding to the most significant bit, bit y, of the bit pair (y, z) output from convolutional encoder 114.

The bit pair (w, x) is provided, along with the bit pair (y, z), at respective inputs of modem 102. Modem 102 assembles the data bits w, x, y and z with the bits ordered (w, x, y and z) from most significant to least significant bits of a four-bit phase point value. Modem 102 provides the shifted phase carrier signal ($\phi$) as discussed above.

Figure 7:
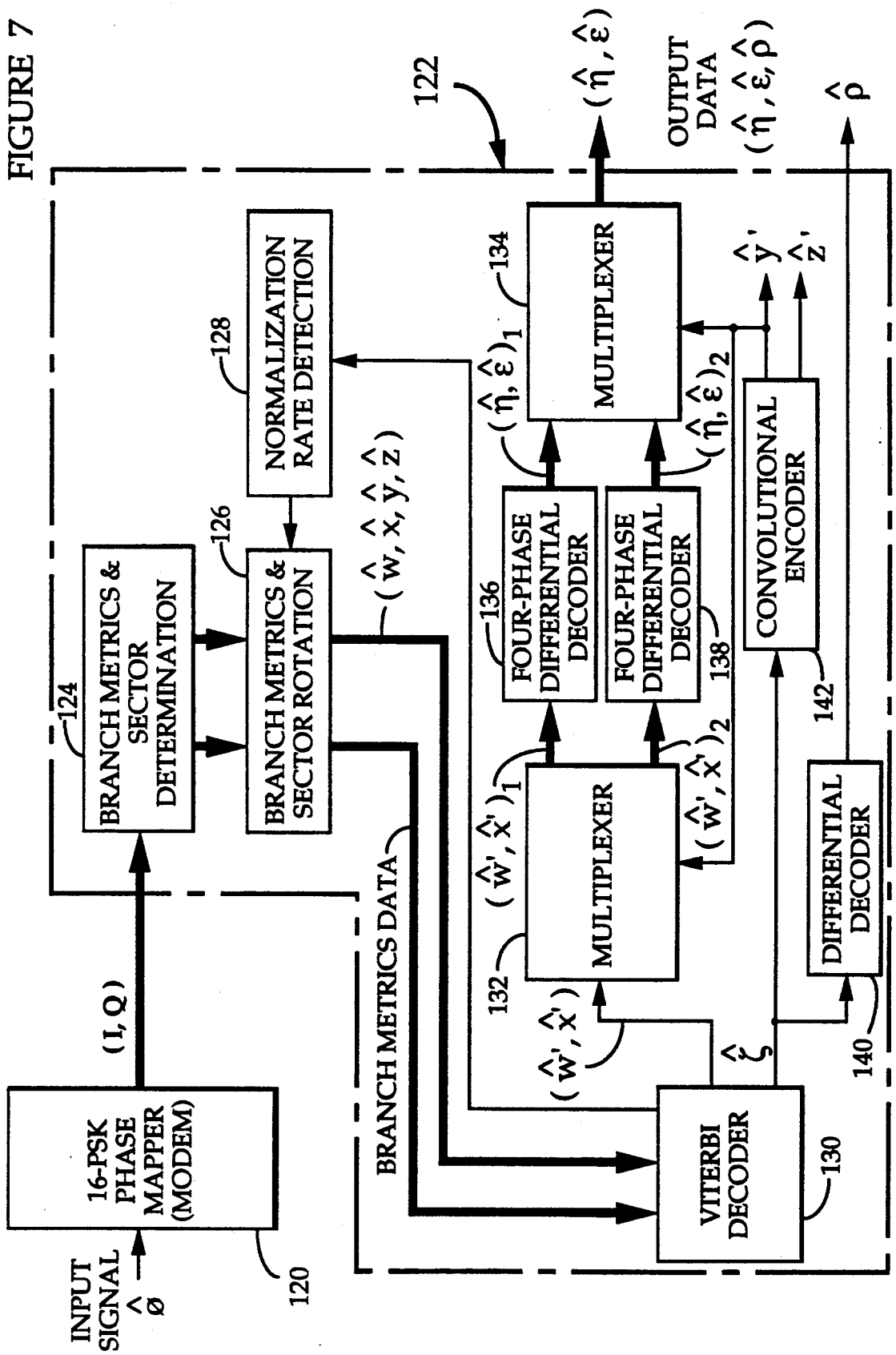
FIG. 7 is a block diagram of an exemplary embodiment of the decoder of the present invention for data encoded by the encoder of FIG. 5.

FIG. 7 illustrates an exemplary embodiment of a modem 120 and TCM decoder 122 of the present invention configured for demodulation of an 16-PSK signal where no phase reference is provided. Modem 120 receives the phase shifted carrier signal $\hat{\phi}$ which contains information in the form of the phase shift in the carrier. However channel conditions may arise which can result in a phase shift in the transmitted signal $\phi$. The received signal $\hat{\phi}$ again may be expressed by equation (10).

Modem 120 converts the received signal $\hat{\phi}$ to quantized I and Q components according to equation (10). The I and Q components are provided to decoder 122 where converted to a four-bit sector value ($\hat{w},\hat{x},\hat{y},\hat{z}$). The sector value ($\hat{w},\hat{x},\hat{y},\hat{z}$) is again related to the phase of the received signal in accordance with equations (12) and (13). Modem circuitry and techniques well known in the art may be utilized to convert the phase of the received signal to I and Q components. Modem 120 may further include an antenna system, RF circuitry and frequency downconversion circuitry necessary to convert the received signal to baseband as is well known in the art.

Modem 120 provides an output of the I and Q components to decoder 122 for decoding and error correction. Decoder 122 is comprised of branch metrics and sector determination circuitry 124; branch metrics and sector rotation circuitry 126; normalization rate detection circuitry 128; Viterbi decoder 130; multiplexers 132 and 134; four-phase differential decoders 136 and 138; binary differential decoder 140; and convolutional encoder 142. With the exclusion of circuitry 124 and 128, decoder 122 is again also preferably of a VLSI construction with the elements thereof of conventional design. Although circuitry 124 and 128 may also be provided on a single VLSI chip, it is preferred that these elements be provided separately to enable flexibility for the end user and be of a conventional design. Again, convolutional encoder 142 may be integrated within Viterbi decoder 130.

The I and Q components are provided to determination circuitry 124 which typically includes an arctangent lookup table (not shown) typically implemented as a read only memory storing values of $\hat{\theta}$. The value of $\hat{\theta}$ is provided to a sector value and branch metric lookup table (not shown), also typically a read only memory, which stores a four-bit sector value along with the branch metrics corresponding to each value of $\hat{\theta}$. The sector value and branch metrics are output from determination circuitry 124 to rotation circuitry 126.

Rotation circuitry 126 rotates the four-bit sector value and corresponding branch metrics in the event of a detection by detection circuitry 128 of an usually high normalization rate in Viterbi decoder 130. In the 16-PSK system, a rotation corresponding to a 22.5° shift in the sector value and related branch metrics is performed. Rotation circuitry 126 may again be configured as a lookup table which is responsive to a signal from detection circuitry 128 for shifting the sector value and branch metrics. Further details on this rotation is discussed below.

Rotation circuitry 126 also contains a delay element (not shown) for providing a delay in the propagation of the sector value as output from rotation circuitry 126 due to the computational time required by the Viterbi decoder 130.

Using the branch metrics and the sector values $(\hat{w},\hat{x},\hat{y},\hat{z})$, rotated if necessary, decoder 130 produces best estimates of $\zeta$ and (w,x), respectively denoted as $\hat{\zeta}$ and $(\hat{w}',\hat{x}')$. Again the method disclosed in the previously mentioned copending application may be utilized to generate these values.

Decoder 130 as previously mentioned also provides an output of normalization data which is used by normalization rate detection circuitry 128 to detect a high normalization rate indicative of channel phase shifts of 22.5°, 67.5°, 112.5°, 157.5°, 202.5°, 247.5°, 292.5°, 315°, or 337.5°. Upon detection of a high normalization rate, detection circuitry 128 provides a control signal to rotation circuitry 126 which in response thereto provides a shift in the branch metrics corresponding to a shift in the signal space of $\pi/8$ along with a corresponding shift in the sector value bits $(\hat{w},\hat{x},\hat{y},\hat{z})$. Such a shift in the sector value results in the sector value corresponding to a phase shift of one of 0°, 45°, 90°, 135°, 180°, 225°, 270° and 315°. At each one of these phase shifts the Viterbi decoder is capable of recovering data. However, for cases other than a 0° phase shift, the 0° case being one in which the data is not corrupted by a channel phase shift, the Viterbi decoder is not capable of detecting that the data is in error as a result of a channel phase shift. The Viterbi decoder would therefore produce erroneous estimates of the original data. The present invention augments the Viterbi decoder so as to permit the resolution of phase ambiguity errors in the data caused by a channel phase shift.

Decoder 130 provides an output of the bit $\hat{\zeta}$ as an input to both differential decoder 140 and convolutional encoder 142. Since the bit $\zeta$ was differentially encoded prior to convolutional encoding on the transmit end, on the receive end the differential encoding on the bit $\hat{\zeta}$ must be decoded to recover the bit $\hat{\rho}$. the bit $\hat{\rho}$ is an estimate of the originally encoded bit $\rho$.

In order to recover an estimate of the transmitted bit pair $(\eta,\epsilon)$ i.e. the bit pair $(\hat{\eta},\hat{\epsilon})$ the stream of paired bits $(\hat{w}',\hat{x}')$ must be broken into two two-bit streams with each bit stream independently four-phase differentially decoded then recombined into a single bit pair stream. The breaking of the bit pair stream into two bit pair streams and recombining is similar in manner to that of the encoder of FIG. 6. Control over the separation and combining of the broken bit pair stream is provided by the bit $\hat{y}$ of the sector value. However, since errors may occur in this bit of the sector value as received, it is preferred that this error be corrected prior to usage of the bit in decoding the bit pair stream $(\hat{w}',\hat{x}')$. Therefore the bit $\hat{\zeta}$, which corresponds indirectly to a corrected sector value, is convolutionally encoded to produce the bits $(\hat{y}',\hat{z}')$.

Again, an alternative to re-encoding the bit $\hat{\zeta}$ to obtain the bits $(\hat{y}',\hat{z}')$, from which the bit $\hat{y}'$ is used as discussed above, one could obtain a less reliable estimate of these bits directly from the I and Q inputs. Use of the bit $\hat{y}'$ generated from error corrected data from Viterbi decoder 130, results in a reduction in errors in this bit with respect a corresponding bit generated directly from the I and Q components.

Using the preferred technique it should be realized that since the bits $(\hat{y}',\hat{z}')$ are estimates of the originally transmitted bits (y, z) that errors in these estimates may occur. However using the preferred re-encoding technique results in a minimization of the possible number of errors in the bit pair $(\hat{\eta},\hat{\epsilon})$.

Accordingly, the bit $\hat{\zeta}$ output from decoder 130 is also provided as an input of convolutional encoder 142 so as to produce bits $(\hat{y}',\hat{z}')$ which are corrected estimates of the transmitted phase point bits (y, z). The most significant bit $(\hat{y}')$ of the bit pair $(\hat{y}',\hat{z}')$ is output from convolutional encoder 142 as a select signal to a select input of each of multiplexers 132 and 134. Although the bit $\hat{z}'$ is also produced by convolutional encoder 142 this bit is not used.

Multiplexer 132 is typically a 1:2 multiplexer which provides data presented at a data pair input thereof to a selected one of two data pair outputs in accordance with the state of the select signal provided at the select input thereof. In this particular case, the data presented at the input of multiplexer 132 is the bit pair $(\hat{w}',\hat{x}')$ from the Viterbi decoder. With the select signal input coupled to the bit $\hat{y}'$ output of convolutional encoder 142, the state of the bit $\hat{y}'$ generated from bit $\hat{\zeta}$ determines at which data pair output of multiplexer 132 the bit pair $(\hat{w}',\hat{x}')$ is presented. When the bit $\hat{y}'$ state is in one logic state, for example a logical "0", the bit pair $(\hat{w}',\hat{x}')$ is output from multiplexer 132 at a first data pair output as the bit pair $(\hat{w}',\hat{x}')_1$. Similarly, when the bit $\hat{y}'$ state is in the other logic state, for example a logical "1", the bit pair $(\hat{w}',\hat{x}')$ is output from multiplexer 132 at a second data pair output as the bit pair $(\hat{w}',\hat{x}')_2$. In essence, the bit pair stream $(\hat{w}',\hat{x}')$ is broken into two bit pair streams according to the state of the most significant bit, bit $\hat{y}'$ of the bit pair $(\hat{y}',\hat{z}')$ output from convolutional encoder 142.

Each data pair output of multiplexer 132 is coupled to a respective input of four-phase differential decoders 136 and 138. The bit pair $(\hat{w}',\hat{x}')_1$ is therefore provided to decoder 136 while the bit pair $(\hat{w}', \hat{x}')_2$ is respectively to decoder 138. Differential decoders 136 and 138 each differentially decode, using four-phase techniques, the respectively received bit pair $(\hat{w}',\hat{x}')_1$ or $(\hat{w}', \hat{x}')_2$ with respect to a correspondingly previously received bit pair. The differential decoding of the bit pair $(\hat{w}',\hat{x}')_1$ or $(\hat{w},\hat{x}')_2$ can be accomplished by any of the techniques well known in the art for four-phase differential decoding. Differential decoders 136 and 138 are thus each exercised only when a new input bit pair is provided thereto. Each of differential decoders 136 and 138 respectively provide an output bit pair $(\hat{\eta},\hat{\epsilon})_1$ or $(\hat{\eta},\hat{\epsilon})_2$ for each corresponding input bit pair $(\hat{w}',\hat{x}')_1$ or $(\hat{w},\hat{x}')_2$. The bit pairs $(\hat{\eta},\hat{\epsilon})_1$ or $(\hat{\eta},\hat{\epsilon})_2$ are respectively provided from differential decoders 136 and 138 to separate data inputs of multiplexer 134.

Multiplexer 134 is typically a 2:1 multiplexer which, in accordance with a select signal provided at a select input, provides a data pair at a data pair output selected from data pairs presented at two data pair inputs. The bit pairs $(\hat{\eta},\hat{\epsilon})_1$ and $(\hat{\eta},\hat{\epsilon})_2$ as presented at the data pair inputs of multiplexer 134 are provided at the data pair output of multiplexer 134, as the bit pair $(\hat{\eta},\hat{\epsilon})$. The bit pair $(\hat{\eta},\hat{\epsilon})_1$ or $(\hat{\eta},\hat{\epsilon})_2$ selected for output is determined in accordance with the state of the bit $\hat{y}'$ generated from bit $\hat{\zeta}$. In essence, the bit pair stream $(\hat{\eta},\hat{\epsilon})_1$ and $(\hat{\eta},\hat{\epsilon})_2$ is merged into a single bit pair stream $(\hat{\eta},\hat{\epsilon})$ corresponding to the most significant bit, bit $\hat{y}'$, of the bit pair $(\hat{y}',\hat{z}')$ output from convolutional encoder 142.

Utilization of the just described encoder and decoder scheme enables trellis coded modulation to become a practical technique in data communication systems. The present invention therefore permits a viable resolution in the encoding and decoding of trellis coded data to overcome phase ambiguities experienced as a result of the transmission channel. The encoder and decoder may be formed in VLSI form on separate chips or preferably on a single chip. Furthermore, the encoder for both the 8-PSK and 16-PSK modulation may be integrally formed using a sharing of common elements, and similarly so for the decoder. Although the exemplary embodiment of the present invention is disclosed in terms of a rate $\frac{1}{2}$, constraint length K=7 code, with 8-PSK and 16-PSK modulation, the teachings of the present invention may be expanded upon to include other code rates, constraint lengths and higher levels of M-ary modulation.

It should also be understood that the present invention is also applicable to not only convolutional codes but also transparent block codes. In such an alternate embodiment of encoders 10 and 100 of FIGS. 2 and 6, encoders 24 and 114 would be configured as block encoders. In these alternate embodiments consideration must be give to the timing of data flowing through encoders 10 and 100. Block encoders need to have an entire input block of bits $\beta$ or $\rho$ to generate a corresponding output block. Since the output bits from the block encoders control the multiplexed encoding of the bits $\alpha$ and $(\eta,\epsilon)$ it is necessary to insure coordination between the output of the block encoders with the input to the multiplexers of the corresponding bits $\alpha$ and $(\eta,\epsilon)$. Circuitry such as a memory or shift register(s) prior to the input of multiplexers 14 and 104 would receive the $\alpha$ or $(\eta,\epsilon)$ bits. The clocking of these bits out of the shift register(s) would be in coordination with the output of the coded bits from the block encoder as provided by the appropriate addressing/timing logic. This technique would ensure that each bit in the block of encoded bits output from the block encoder would correspond to one of an input $\alpha$ or $(\eta,\epsilon)$ bit(s) in controlling the multiplexed encoding of these bits.

On the decoding end, Viterbi decoders 40 and 130 would be replaced by corresponding block decoders with the least significant bits $(\hat{b},\hat{c})$ or $(\hat{y},\hat{z})$ of the sector value input directly to the block decoder as soft decision data. Encoders 52 and 142 would also be configured as block encoders identical respectively to the block encoders in the corresponding encoder 10 or 100. Again it is necessary to control the timing of the bits $\hat{a}$ and $(\hat{w},\hat{x})$ through the multiplexed decoding circuitry. Circuitry such as a memory or shift register(s) with the appropriate addressing/timing logic would again ensure that each bit in the block of decoded bits output from the block decoder would correspond to one of a re-encoded estimate of the bits b or y that were used in controlling the original encoding of the $\alpha$ and $(\eta,\epsilon)$ bits.

The previous description of the preferred embodiments is provided to enable any person skilled in the art to make or sue the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

I claim:

1. An apparatus for trellis coding of user data as phase point data for M-ary modulation and transmission upon a communication channel, comprising:

first encoder means for receiving a first data bit group from each set of input user data bits in a sequence of input user data bit sets, encoding each first data bit group according to a first coding format to provide a corresponding first coded bit group, encoding each first coded bit group according to a second coding format to provide a corresponding second coded bit group;

second encoder means for receiving a second data bit group from each set of input user data bits, and responsive to a predetermined bit of said second coded bit group for selecting a data path from a plurality of data paths, providing each second data bit group upon said selected data path, encoding each second data bit group as provided upon said selected data path according to a third coding format to provide a corresponding third coded bit group; and wherein for each input user data bit set corresponding second and third coded bit groups collectively represent phase point data.

2. The apparatus of claim 1 wherein said second and third coded bit groups respectively represent least significant and most significant bits of phase point data.

3. The apparatus of claim 1 wherein each input user data bit set is comprised of a pair of data bits with said said first data bit group and said second data bit group each respectively comprised of a different data bit of said pair of data bits.

4. The apparatus of claim 1 wherein each input user data bit set is comprised of three data bits with said first data bit group comprised of a single data bit and said second data bit group comprised of a remaining pair of data bits.

5. The apparatus of claim 1 wherein said first and third coding formats are binary differential coding and said second coding format is convolutional coding.

6. The apparatus of claim 1 wherein said first coding format is binary differential coding, said second coding format is convolutional coding and said third coding format is four-phase differential coding.

7. The apparatus of claim 3 wherein said first encoder means comprises:

first differential encoder means for receiving and differentially encoding said data bit of said first data bit group, and for providing a corresponding first output bit; and convolutional encoder means for receiving and convolutionally encoding said first output bit, and for providing a pair of second output bits as said second coded bit group.

8. The apparatus of claim 7 wherein said second encoder means comprises:

first multiplexer means for receiving said data bit of said second data bit group and one of said second output bits, said first multiplexer means responsive to said one of said second output bits for providing said data bit of said second data bit group as a third output bit at a selected one of two first multiplexer means outputs;

second differential encoder means for receiving and differentially encoding said third output bit when respectively provided thereto from one of said two first multiplexer means outputs, and for providing a corresponding fourth output bit;

third differential encoder means for receiving and differentially encoding said third output bit when respectively provided thereto from another one of said two first multiplexer means outputs, and for providing a corresponding fifth output bit; and second multiplexer means for respectively receiving said fourth and fifth output bits, said second multiplexer means responsive to said one of said second output bits for providing an output of said selected one of said fourth and fifth output bits.

9. The apparatus of claim 4 wherein said first encoder means comprises:

first differential encoder means for receiving and differentially encoding said data bit of said first data bit group, and for providing a corresponding first output bit; and convolutional encoder means for receiving and convolutionally encoding said first output bit, and for providing a pair of second output bits as said second coded bit group.

10. The apparatus of claim 9 wherein said second encoder means comprises:

first multiplexer means for receiving said pair of data bits of said second data bit group and one of said second output bits, said first multiplexer means responsive to said one of said second output bits for providing said pair of data bits as a first output bit pair at a selected one of two first multiplexer means outputs;

second differential encoder means for receiving and differentially encoding said first output bit pair when respectively provided thereto from one of said two first multiplexer means bit pair outputs, and for providing a a corresponding second output bit pair;

third differential encoder means for receiving and four-phase differentially encoding said second output bit pair when respectively provided thereto from another one of said two first multiplexer means bit pair outputs, and for providing a corresponding a third output bit pair; and second multiplexer means for respectively receiving said second and third output bit pairs, said second multiplexer means responsive to said one of said second output bits for providing an output of said selected one of said third and fourth output bit pairs.

11. The apparatus of claim 1 further comprising modem means for, receiving and assembling said second and third coded bit groups in a predetermined order as phase point data, providing a carrier signal, shifting the phase of said carrier signal for each phase point data according to a predetermined phase point data/phase shift mapping scheme.

12. A trellis encoder for 8-PSK modulation comprising:

a first differential encoder having an input capable of receiving one data bit of a set of two input data bits, and an output;

a convolutional encoder having an input coupled to an output of said first differential encoder, a most significant bit output and and a least significant bit output;

a first multiplexer having a data input capable of receiving another data bit of said set of two input data bits, a select input coupled to said convolutional encoder most significant bit output and a pair of outputs;

a second differential encoder having an input coupled to one of said first multiplexer outputs;

a third differential encoder each having an input coupled to another one of said first multiplexer outputs; and a second multiplexer having a pair of data inputs each respectively coupled to a different one of said second and third differential encoder outputs, a select input coupled to said convolutional encoder most significant bit output and an output.

13. The encoder of claim 12 wherein said convolutional encoder is of a rate $\frac{1}{2}$.

14. The encoder of claim 12 wherein said first, second and third differential encoders are binary differential encoders.

15. The encoder of claim 13 wherein said first, second and third differential encoders are binary differential encoders.

16. A trellis encoder for 16-PSK modulation comprising:

a first differential encoder having an input capable of receiving one data bit of a set of three input data bits, and an output;

a convolutional encoder having an input coupled to an output of said first differential encoder, a most significant bit output and and a least significant bit output;

a first multiplexer having a data bit pair input capable of receiving a pair of other data bits of said set of three input data bits, a select input coupled to said convolutional encoder most significant bit output and a pair of data bit pair outputs;

a second differential encoder having a data bit pair input coupled to one of said first multiplexer data bit pair outputs;

a third differential encoder each having a data bit pair input coupled to another one of said first multiplexer data bit pair outputs; and a second multiplexer having a pair of data bit pair inputs each respectively coupled to a different one of said second and third differential encoder data bit pair outputs, a select input coupled to said convolutional encoder most significant bit outputs and a data bit pair output.

17. The encoder of claim 16 wherein said convolutional encoder is of a rate $\frac{1}{2}$.

18. The encoder of claim 16 wherein said first differential encoder is a binary differential encoder, and said second and third differential encoders are four-phase differential encoders.

19. The encoder of claim 17 wherein said first differential encoder is a binary differential encoder, and said second and third differential encoders are four-phase differential encoders.

20. A method for encoding user data as trellis coded data comprising the steps of:

receiving a first data bit group from each set of input user data bits in a sequence of input user data bit sets;

encoding each first data bit group according to a first coding format to provide a corresponding first coded bit group;

encoding each first coded bit group according to a second coding format to provide a corresponding second coded bit group;

receiving a second data bit group from each set of input user data bits; selecting a data path of a plurality of data paths in response to a predetermined bit of said second coded bit group;

providing each second data bit group upon said selected data path;

encoding each second data bit group as provided upon said selected data path according to a third coding format;

to provide a corresponding third coded bit group; and wherein for each input user data bit set corresponding second and third coded bit groups collectively represent phase point data.

21. The method of claim 20 wherein said step of encoding each first data bit group comprises the step of differentially encoding each first data bit group.

22. The method of claim 20 wherein said step of encoding each first encoded bit group comprises the step of convolutionally encoding each first encoded bit group.

23. The method of claim 20 wherein said step of encoding each selected data path second data bit group according to a third coding format comprises the step of differentially encoding each second encoded bit group.

24. The method of claim 20 further comprising the steps of:

providing a carrier signal; and shifting the phase of said carrier signal for each phase point data in accordance with a predetermined phase point data/phase shift mapping scheme.

25. In a decoder for decoding received user data that is trellis coded as phase point data in an M-ary modulation scheme for transmission upon a communication channel which is susceptible to changes in channel conditions to induce phase ambiguities in said M-ary modulated signals and resulting in corresponding errors in said phase point data as received, an apparatus for resolving the effect of phase ambiguity errors in said phase point data during the decoding of said trellis coded user data comprising:

first decoder means for receiving error corrected estimates of groups of first encoded user data bits, each first encoded user data bit group estimate derived from a corresponding received phase point, decoding each first encoded user data bit group estimate according to a first decoding format to provide an output estimate of a first user data bit group, encoding each first encoded user data bit group estimate according to a first coding format to provide a corresponding group of first coded bits;

second decoder means for receiving estimates of groups of second encoded user data bits, each second encoded user data bit group estimate derived from a corresponding received phase point, said second decoder means responsive to a predetermined bit of each first coded bit group for selecting a data path from a plurality of data paths, providing each second encoded user data bit group estimate upon said selected data path, respectively decoding each second encoded user data bit group estimate according to a second decoding format as provided upon said selected data path to provide an estimate of a second user data bit group; and wherein corresponding first and second user data bit groups represent an estimate of said user data.

26. The apparatus of claim 25 wherein each of said first encoded user data bit group estimate and said first user data bit group estimate are respectively comprised of a single data bit, each said first coded bit group is comprised of a pair of data bits, and said first decoder means is comprised of:

first differential decoder means for receiving and differentially encoding said data bit of said first encoded user data bit group estimate and for providing an output thereof as an estimate of a first user data bit; and convolutional encoder means for receiving and convolutionally encoding said data bit of said first encoded user data bit group estimate and for providing an output of said pair of data bits of said first coded bit group.

27. The apparatus of claim 26 wherein each second encoded user data bit group estimate is comprised of a single data bit and said second decoder means is comprised of:

first multiplexer means for receiving said data bit of each second encoded user data bit group estimate and a predetermined data bit of said first coded bit group, said first multiplexer means responsive to said predetermined data bit of said first coded bit group for providing said data bit of each second encoded user data bit group estimate as a first output bit at a selected one of two first multiplexer means outputs;

second differential encoder means for receiving and differentially encoding said first output bit when respectively provided thereto from one of said two first multiplexer means outputs, and for providing a corresponding a corresponding second output bit;

third differential encoder means for receiving and differentially encoding said first output bit when respectively provided thereto from another one of said two first multiplexer means outputs, and for providing a corresponding third output bit; and second multiplexer means for respectively receiving said second and third output bits, said second multiplexer means responsive to said predetermined data bit of said first coded bit group for providing an output of said selected one of said second and third output bits.

28. The apparatus of claim 26 wherein each second encoded user data bit group estimate is comprised of a pair of data bits and said second decoder means is comprised of:

first multiplexer means for receiving said data bit pair of each second encoded user data bit group estimate and a predetermined data bit of said first coded bit group, said first multiplexer means responsive to said predetermined data bit of said first coded bit group for providing said data bit pair of each second encoded user data bit group estimate as a first output bit pair at a selected one of two first multiplexer means outputs;

second differential encoder means for receiving and differentially encoding said first output bit pair when respectively provided thereto from one of said two first multiplexer means outputs, and for providing a corresponding a corresponding second output bit pair;

third differential encoder means for receiving and differentially encoding said first output bit pair when respectively provided thereto from another one of said two first multiplexer means outputs, and for providing a corresponding third output bit pair; and second multiplexer means for respectively receiving said second and third output bit pairs, said second multiplexer means responsive to said predetermined data bit of said first coded bit group for providing an output of said selected one of said secodn and output third bit pairs.

29. The apparatus of claim 25 wherein each of said first encoded user data bit group estimate and said first user data bit group estimate are respectively comprised of a single data bit, each said first coded bit group is comprised of a pair of data bits, and said first decoder means is comprised of:
first differential decoder means for receiving and differentially encoding said data bit of said first encoded user data bit group estimate and for providing an output thereof as an estimate of a first user data bit; and
block encoder means for receiving and transparent block encoding said data bit of said first encoded user data bit group estimate and for providing an output of said pair of data bits of said first coded bit group.

30. In a decoder for decoding trellis coded user data, transmitted as phase point data in an 8-PSK modulation format, in which a Viterbi decoder provides estimates of (1) a first differentially encoded data bit originally subjected in sequence to differential and convolutional encoding for inclusion as a pair of bits of said phase point data, and (2) a differentially encoded second data bit originally subjected to multiplexed differential encoding for inclusion as another bit of said phase point data, a circuit for resolving transmission channel induced phase ambiguities in said phase point data as received at said decoder, comprising:
a first differential decoder having an input capable of receiving said first bit estimate, and an output;
a convolutional encoder having an input capable of receiving said first bit estimate, a most significant bit output and a least significant bit output;
a first multiplexer having a data input capable of receiving said second bit estimate, a select input coupled to said convolutional encoder most significant bit output and a pair of outputs;
a second differential decoder having an input coupled to one of said first multiplexer outputs;
a third differential decoder having an input coupled to another one of said first multiplexer outputs; and
a second multiplexer having a pair of data inputs each respectively coupled to a different one of said second and third differential decoder outputs, a select input coupled to said convolutional encoder most significant bit output and an output.

31. The circuit of claim 30 wherein said convolutional encoder is of a rate $\frac{1}{2}$.

32. The circuit of claim 30, wherein said first, second and third differential encoders are binary differential encoders.

33. The circuit of claim 31 wherein said first, second and third differential encoders are binary differential encoders.

34. In a decoder for decoding trellis coded user data, transmitted as phase point data in an 16-PSK modulation format, in which a Viterbi decoder provides estimates of (1) a first differentially encoded data bit originally subjected in sequence to differential and convolutional encoding for inclusion as a pair of bits of said phase point data, and (2) a differentially encoded first data bit pair originally subjected to multiplexed differential encoding for inclusion as other bits of said phase point data, a circuit for resolving transmission channel induced phase ambiguities in said phase point data as received at said decoder, comprising:
a first differential decoder having an input capable of receiving said first bit estimate, and an output;
a convolutional encoder having an input capable of receiving said first bit estimate, a most significant bit output and and a least significant bit output;
a first multiplexer having a data input capable of receiving said first bit pair estimate, a select input coupled to said convolutional encoder most significant bit output and a pair of outputs;
a second differential decoder having an input coupled to one of said first multiplexer outputs;
a third differential decoder having an input coupled to another one of said first multiplexer outputs; and
a second multiplexer having a pair of data inputs each respectively coupled to a differential one of said second and third differential decoder outputs, a select input coupled to said convolutional encoder most significant bit output and an output.

35. The decoder of claim 34 wherein said convolutional encoder is of a rate $\frac{1}{2}$.

36. The decoder of claim 34 wherein said first differential decoder is a binary differential encoder, and said second and third differential decoder are four-phase differential decoder.

37. The decoder of claim 35 wherein said first differential decoder is a binary differential decoder, and said second and third differential decoders are four-phase differential decoders.

38. In a decoder for decoding received user data that is trellis coded as phase point data in an M-ary modulation scheme for transmission upon a communication channel which is susceptible to changes in channel conditions to induce phase ambiguities in said M-ary modulated signals and resulting in corresponding errors in said phase point data as received, a method for resolving the effect of phase ambiguity errors in said phase point data during the decoding of said trellis coded user data comprising:
receiving error corrected estimates of groups of first encoded user data bits wherein each first encoded user data bit group estimate is derived from a corresponding received phase point;
decoding each first encoded user data bit group estimate according to a first decoding format to provide a corresponding output estimate of a first user data bit group;
encoding each first encoded user data bit group estimate according to a first coding format to provide a corresponding group of first coded bits;
receiving estimates of groups of second encoded user data bits wherein each second encoded user data bit group estimate is derived from a corresponding received phase point;
selecting a data path of a plurality of data paths in response to a predetermined bit of each first coded bit group;
providing each second encoded user data bit group estimate upon said selected data path;
decoding each second encoded user data bit group estimate as provided upon said selected data path according to a second decoding format;
to provide a corresponding estimate of a second user data bit group; and
wherein corresponding first and second user data bit groups represent an estimate of said user data.

39. The method of claim 38 wherein said step of decoding each first encoded user data bit group estimate comprises the step of differentially decoding each first encoded user data bit group estimate.

40. The method of claim 38 wherein said step of encoding each first encoded user data bit group estimate comprises the step of convolutionally encoding each first encoded user data bit group estimate.

41. The method of claim 38 wherein said step of decoding each second encoded user data bit group comprises the step of differentially decoding each second encoded user data bit group estimate.

* * * * *